(12) United States Patent
Uchikawa et al.

(10) Patent No.: US 8,572,465 B2
(45) Date of Patent: Oct. 29, 2013

(54) NONVOLATILE SEMICONDUCTOR MEMORY SYSTEM HAVING FIRST AND SECOND ERROR CORRECTION UNITS

(75) Inventors: Hironori Uchikawa, Kanagawa-ken (JP); Yoshihisa Kondo, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 416 days.

(21) Appl. No.: 12/848,476

(22) Filed: Aug. 2, 2010

(65) Prior Publication Data

US 2011/0219284 A1    Sep. 8, 2011

(30) Foreign Application Priority Data

Mar. 2, 2010   (JP) .................................. 2010-045695

(51) Int. Cl.
*G06F 11/00*   (2006.01)

(52) U.S. Cl.
USPC ............................ 714/774; 714/779; 714/780

(58) Field of Classification Search
USPC ......................................... 714/774, 779, 780
See application file for complete search history.

(56) References Cited

U.S. PATENT DOCUMENTS

| | | | |
|---|---|---|---|
| 7,508,704 B2 | 3/2009 | Honma et al. | |
| 7,979,774 B1 * | 7/2011 | Varnica et al. | ................. 714/752 |
| 2008/0123408 A1 * | 5/2008 | Honma et al. | ............ 365/185.03 |
| 2008/0301518 A1 * | 12/2008 | Miyazaki | ...................... 714/752 |
| 2009/0201726 A1 | 8/2009 | Honma et al. | |
| 2009/0287983 A1 * | 11/2009 | Truong et al. | .................. 714/785 |

FOREIGN PATENT DOCUMENTS

| | | |
|---|---|---|
| JP | 2009-59422 | 3/2009 |
| WO | WO 2007/091327 A1 | 8/2007 |

OTHER PUBLICATIONS

Lucile Sassatelli, et al. "Two-Bit Message Passing Decoders for LDPC Codes Over the Binary Symmetric Channel." IEEE International Symposium on Information Theory. ISIT 2009. Jun. 28-Jul. 3, 2009. 5 pages.

Office Action issued Jan. 10, 2012 in Japan Application No. 2010-045695 (With English Translation).

* cited by examiner

*Primary Examiner* — Bryce Bonzo
*Assistant Examiner* — Elmira Mehrmanesh
(74) *Attorney, Agent, or Firm* — Oblon, Spivak, McClelland, Maier & Neustadt, L.L.P.

(57) ABSTRACT

A nonvolatile semiconductor memory system includes a semiconductor memory, at least one first error correction unit and at least one second error correction unit. The semiconductor memory stores a data frame encoded with LDPC codes. The at least one first error correction unit performs a first error correction for the data frame according to a first iterative decoding algorithm. The at least one second error correction unit performs a second error correction for the data frame which is failed to correct error by the at least one first error correction unit. The at least one second error correction unit performs the second error correction according to a second iterative decoding algorithm which uses a message having a larger number of quantization bits than that of the first iterative decoding algorithm.

19 Claims, 11 Drawing Sheets

NONVOLATILE SEMICONDUCTOR MEMORY SYSTEM HAVING FIRST AND SECOND ERROR CORRECTION UNITS

CROSS-REFERENCE TO RELATED APPLICATION

This application is based upon and claims the benefit of priority from Japanese Patent Application No. 2010-045695, filed on Mar. 2, 2010, the entire contents of which are incorporated herein by reference.

FIELD

Embodiments described herein relate generally to a nonvolatile semiconductor memory system.

BACKGROUND

A nonvolatile semiconductor memory system including a nonvolatile semiconductor memory, such as a NAND-type flash memory, uses an ECC (Error Correcting Code) in order to correct error caused in process of reading data.

One of the ECCs is LDPC (Low Density Parity Check) codes which is adopted a repeated calculation based on a probability. If the ECC is applied to the data, an error correction circuit can correct the error. In the nonvolatile semiconductor memory system, plural error correction circuits are arranged in parallel in order to achieve fast reading the data from the nonvolatile semiconductor memory.

The Error in the data may be corrected by decoding the data which is encoded by the ECC. Recently, a decoding algorithm is popular, which detects and corrects the error by using a soft-decision value based on a threshold voltage of a memory cell. One of the decoding algorithms is disclosed in JP-A 2008-16092 (KOKAI). By using the decoding algorithm, the nonvolatile semiconductor memory system realizes to detect and correct the error with high accuracy.

However, size of the error correction circuit using the soft-decision value is usually large. Therefore, size of the nonvolatile semiconductor memory system including the plural error correction circuits in parallel becomes also large. As a result, power consumption of the nonvolatile semiconductor memory system increases.

BRIEF DESCRIPTION OF THE DRAWINGS

Aspects of this disclosure will become apparent upon reading the following detailed description and upon reference to the accompanying drawings. The description and the associated drawings are provided to illustrate embodiments of the invention and not limited to the scope of the invention.

DETAILED DESCRIPTION

According to one aspect of the invention, a nonvolatile semiconductor memory system includes a semiconductor memory to store a data frame encoded with LDPC (Low Density Parity Check) codes; at least one first error correction unit configured to perform a first error correction for the data frame according to a first iterative decoding algorithm; and at least one second error correction unit configured to perform a second error correction for the data frame which is failed to correct error by the at least one first error correction unit, the second error correction being performed according to a second iterative decoding algorithm which uses a message having a larger number of quantization bits than that of the first iterative decoding algorithm.

According to another aspect of the invention, a nonvolatile semiconductor memory system includes a semiconductor memory to store a data frame encoded with LDPC codes and soft-decision values, each corresponding to each of bits included in the data frame; at least one first error correction unit configured to perform an first error correction for the data frame according to a first iterative decoding algorithm; and at least one second error correction unit configured to perform a second error correction for the data frame which is failed to correct error by the at least one first error correction unit, the second error correction being performed using the soft-decision value according to a second iterative decoding algorithm, the second iterative decoding algorithm using a message having a larger number of quantization bits than that of the first iterative decoding algorithm, and the number of the at least one second error correction unit is equal to or smaller than that of the at least one first error correction unit.

The embodiments will be explained with reference to the accompanying drawings. A nonvolatile semiconductor memory system according to each of the embodiments includes a nonvolatile semiconductor memory. Data bit sequence is encoded by an ECC (Error Correcting Code) to obtain encoded bit sequence. The encoded bit sequence is stored in the nonvolatile semiconductor memory. When the encoded bit sequence is read from the nonvolatile semiconductor memory, error may be caused in the encoded bit sequence. The nonvolatile semiconductor memory system tries to correct the error by a LDPC (Low Density Parity Check) codes which is one of the ECCs. In the embodiments, the nonvolatile semiconductor memory may be a NAND-type flash memory (hereinafter, referred to as "flash memory"). Moreover, in the embodiments, "error correction" and "decoding" have same meaning, which both mean detecting and correcting the error included in the encoded bit.

Description of the First Embodiment

Figure 1:
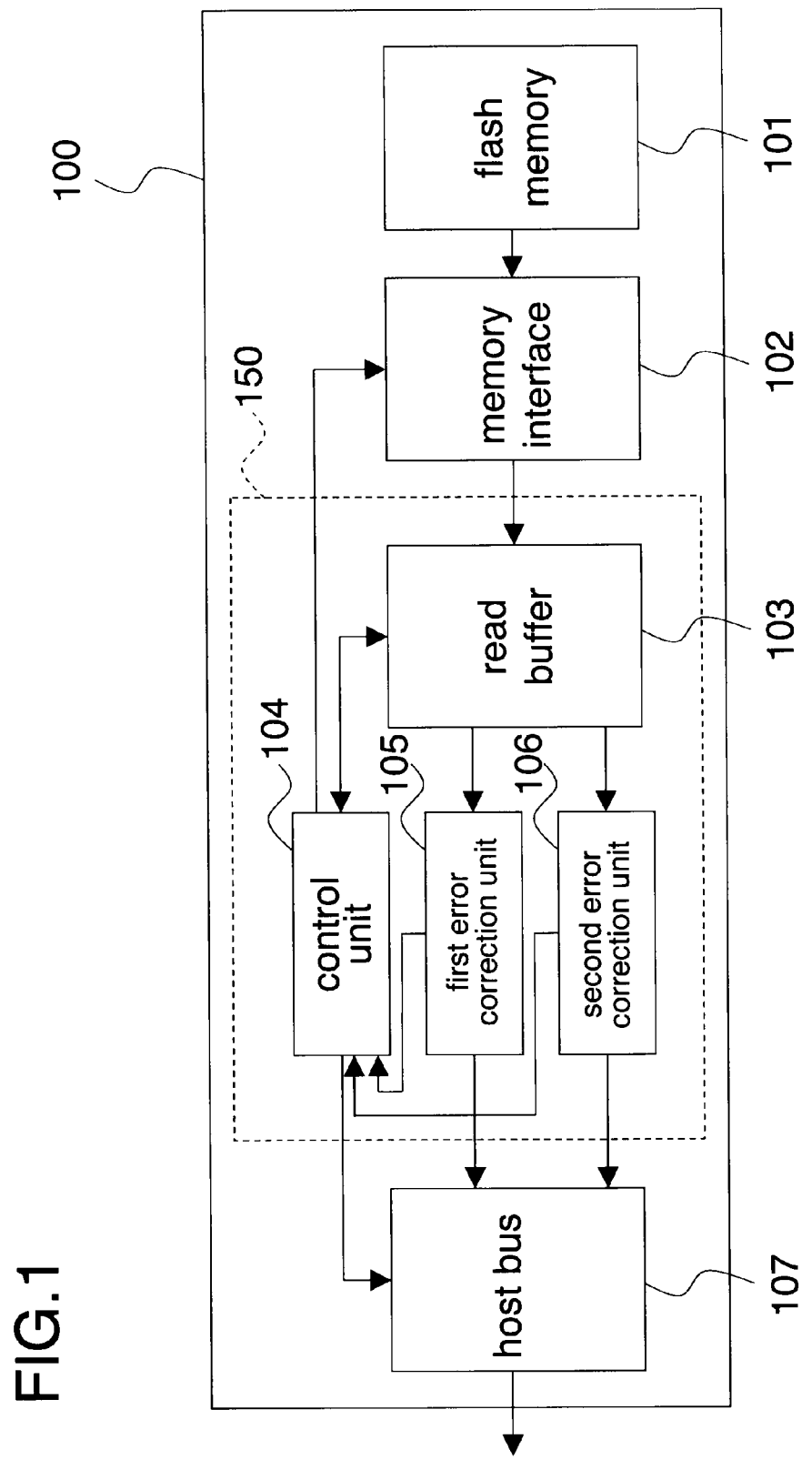
FIG. 1 is a block diagram of a nonvolatile semiconductor memory system according to the first embodiment.

As shown in FIG. 1, a nonvolatile semiconductor memory system 100 includes a flash memory 101, a memory interface 102, an error correction device 150 and a host bus 107. The error correction device 150 includes a read buffer 103, a control unit 104, a first error correction unit 105, and a second error correction unit 106.

The nonvolatile semiconductor memory system 100 may further include a unit (not shown) configured to encode the data bit sequence to obtain the encoded bit sequence. For example, the nonvolatile semiconductor memory system 100 may have an encoding device (not shown) and a program device (not shown). Information data inputted from external is encoded into an ECC frame (data frame) by the encoding device using, for example, LDPC codes. Encoding and decoding processes are performed for each of the ECC frames. The ECC includes information data and parity data. Each of the information data and the parity data includes plural number of bits. The program device instructs the flash memory 101 to store the ECC frame.

The encoding device generates the parity data corresponding to each of the information data based on a generator matrix G. The generator matrix G is preliminarily set to the encoding device. Then, the encoding device adds the parity data to the information data to obtain the ECC frame. The generator matrix G fills $GH^T=0$, where H is a parity check matrix described later. A superscript T means a transposed matrix. "0" means a zero vector. Encoding with LDPC codes is same meaning to calculate an encoded bit sequence C filling VG=C, where a bit sequence V is the information data. The encoded bit sequence C corresponds to the ECC frame.

The flash memory 101 has an array structure. The array structure is formed by connecting plural of memory cells in NAND-type. That is, the flash memory 101 is a NAND-type flash memory. In the NAND-type flash memory, the plural memory cells are arranged along plural word lines and plural bit lines to form a matrix. The word lines and the bit lines are crossing each other. Writing and reading data are performed per a group of the memory cells which are connected to a word line. Hereinafter, the group of the memory cells is referred to as "page". In other word, writing and reading data are performed per the page. Moreover, deleting data is performed per a block. Size of the page is determined depending on a structure of the flash memory, and usually several [KB]. In the embodiments, we will skip to explain the writing process, but explain the reading process.

More than two threshold voltages are set to each of the memory cells. Moreover, each memory cell holds data having a length of at least 1-bit. Number of the bits is not limited. An example case, which the length of the data is 2-bit, is considered below. The data are respectively "11", "10", "01", "00". In this case, four threshold voltages Vth are set to each of the memory cells. One of the threshold voltages Vth filling Vth<0 [V] may correspond to "11". Another of the threshold voltages Vth filling 0 [V]<Vth<Vth1 may correspond to "01". Another of the threshold voltages Vth filling Vth1<Vth<Vth2 may correspond to "00". The other of the threshold voltages Vth filling Vth2<Vth<Vth3 may correspond to "10".

The control unit 104 instructs the memory interface 102 to read the data from the flash memory 101. Specifically, the memory interface 102 adds voltage to the word line and checks the threshold voltage Vth. The data is determined according to the threshold voltage Vth. That is, the data is read as a page data 200 and outputted to the read buffer 103.

Figure 2:
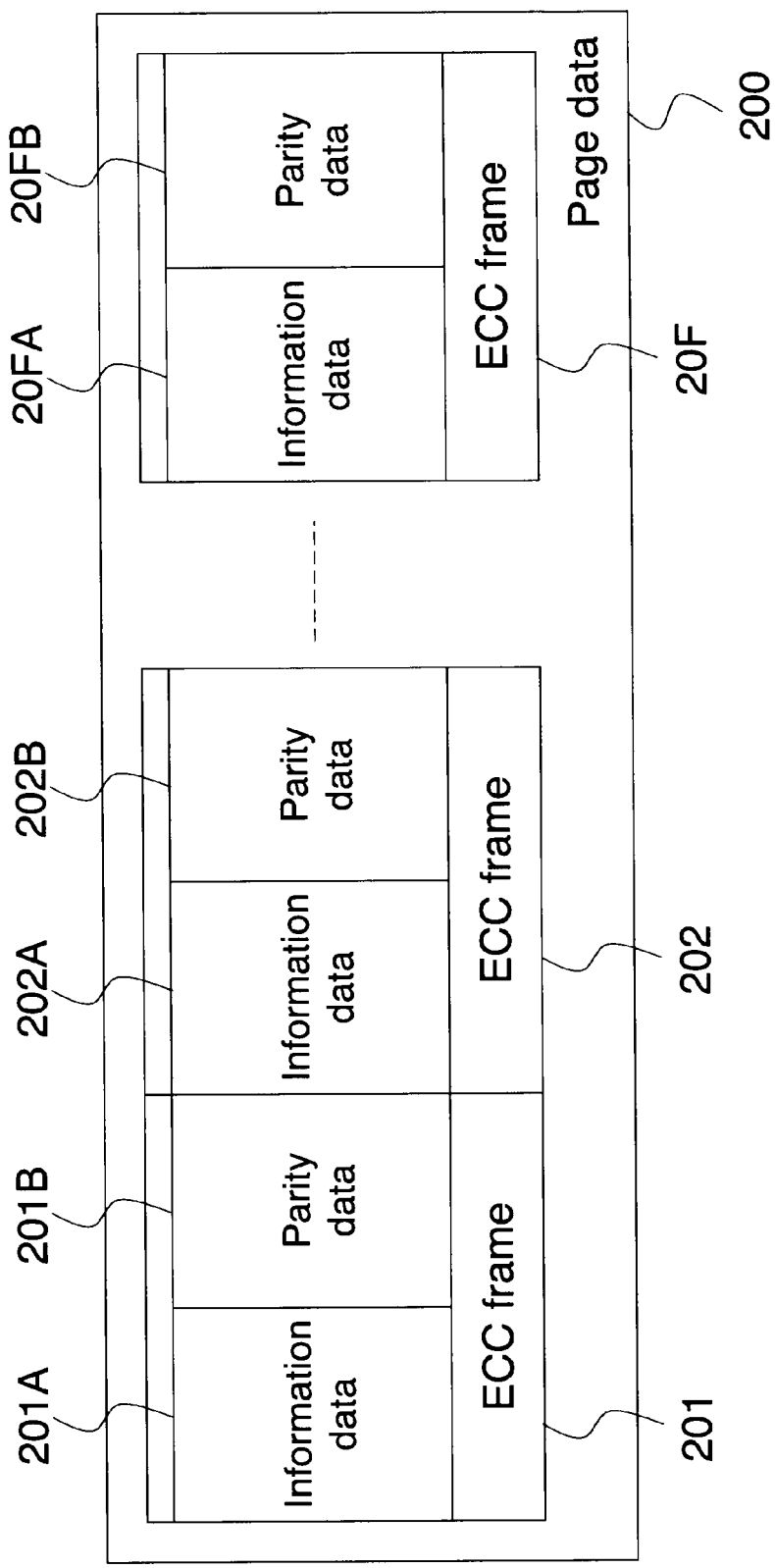
FIG. 2 shows a data structure of a page data.

As shown in FIG. 2, the page data 200 according to the first embodiment includes ECC frames 201-20F ("F" is natural number). Each of the ECC frames 201-20F includes each of the information data 201-20FA and each of the parity data 201B-20FB, respectively. In FIG. 2, the parity data 201B-20FB may be generated based on LDPC codes. Each of the ECC frames 201-20F may further include other parity data generated based on other error correcting code.

The page data including the ECC frames are temporarily stored in the read buffer 103. Then, the control unit 104 instructs the read buffer 103 to output the ECC frame to the first error correction unit 105 or the second error correction unit 106 at certain timing. The read buffer 103 keeps holding the page data until completing error corrections for all ECC frames included in the page data. Or, the read buffer 103 may hold each of the ECC frames until completing the error correction for the ECC frame. In this case, the read buffer 103 deletes the ECC frames in order of completing the error correction.

The control unit 104 controls the nonvolatile semiconductor memory system 100. For example, the control unit 104 checks amount of free space in the read buffer 103. If the amount of the free space is enough to perform the error correction, the control unit 104 instructs the memory interface 102 to read the page data from the flash memory 101. Then, the control unit 104 instructs the memory interface 102 to output the page data to the read buffer 103. Moreover, the control unit 104 instructs the read buffer 103 to output the ECC frame included in the page data to the first error correction unit 105 or the second error correction unit 106. Also, the control unit 104 controls the error correction device 150 as that the first error correction unit 105 first tries to correct the error for the ECC frame and if the first error correction unit 105 fails to correct the error, the second error correction unit 106 tries to correct the error for the ECC frame.

The first error correction unit 105 corrects the error of the ECC frame according to a decoding algorithm, for example, a first iterative decoding algorithm using a message of 2-bit. A decoding process at the first error correction unit 105 is described later. After the first error correction unit 105 completes correcting the error of the ECC frame, the first error correction unit 105 removes the parity data from the ECC frame and output the information data in the ECC frame to the host bus 107. After completing the error correction, the first error correction unit 105 gets next ECC frame from the read buffer 103 and performs the error correction for the next ECC frame.

The second error correction unit 106 corrects the error of the ECC frame according to a second iterative decoding algorithm. The second iterative decoding algorithm uses a message having a larger number of quantization bits than that of the first iterative decoding algorithm. The second error correction unit 106 has higher error correction ability than the first error correction unit 105 because of the larger number of quantization bits. However, the second error correction unit 106 has larger circuit size than the first error correction unit 105. Therefore, the second error correction unit 106 consumes larger power than the first error correction unit 105.

After the second error correction unit 106 completes the error correction for the ECC frame, the second error correction unit 106 removes the parity data from the ECC frame and output the information data in the ECC frame to the host bus 107.

If the host bus 107 receives the information data from the first error correction unit 105 or the second error correction unit 106, the host bus 107 temporarily stores the information data. Then, the information data is converted to a suitable format and outputted to a signal processing unit (not shown) according to instruction from the control unit 104.

In the first embodiment, if the first error correction unit 105 succeeds in correcting the error of the ECC frame, the corrected information data is outputted to the host bus 107 without being performed the error correction by the second error correction unit 106. In other word, the second error correction unit 106, which consumes larger power, operates only when the first error correction unit 105 fails to correct error. Therefore, the nonvolatile semiconductor memory system 100 can reduce the power consumption with keeping high error correction ability.

Hereinafter, we will explain the decoding process at the first error correction unit 105. If the first error correction unit 105 receives the ECC frame from the read buffer 103, the first error correction unit 105 performs parity check. In the parity check, the encoded bit sequence C (which is same as the ECC frame) is multiplied by a parity check matrix H to obtain data bit sequence (hereinafter, referred to as "syndrome"). The syndrome includes elements and each of the elements is "0" or "1". The first error correction unit 105 checks whether or not the syndrome includes the element of "1". If all elements are "0", this means that the ECC frame does not include the error. If at least one element is "1", this means that the ECC frame includes the error.

Figure 3:
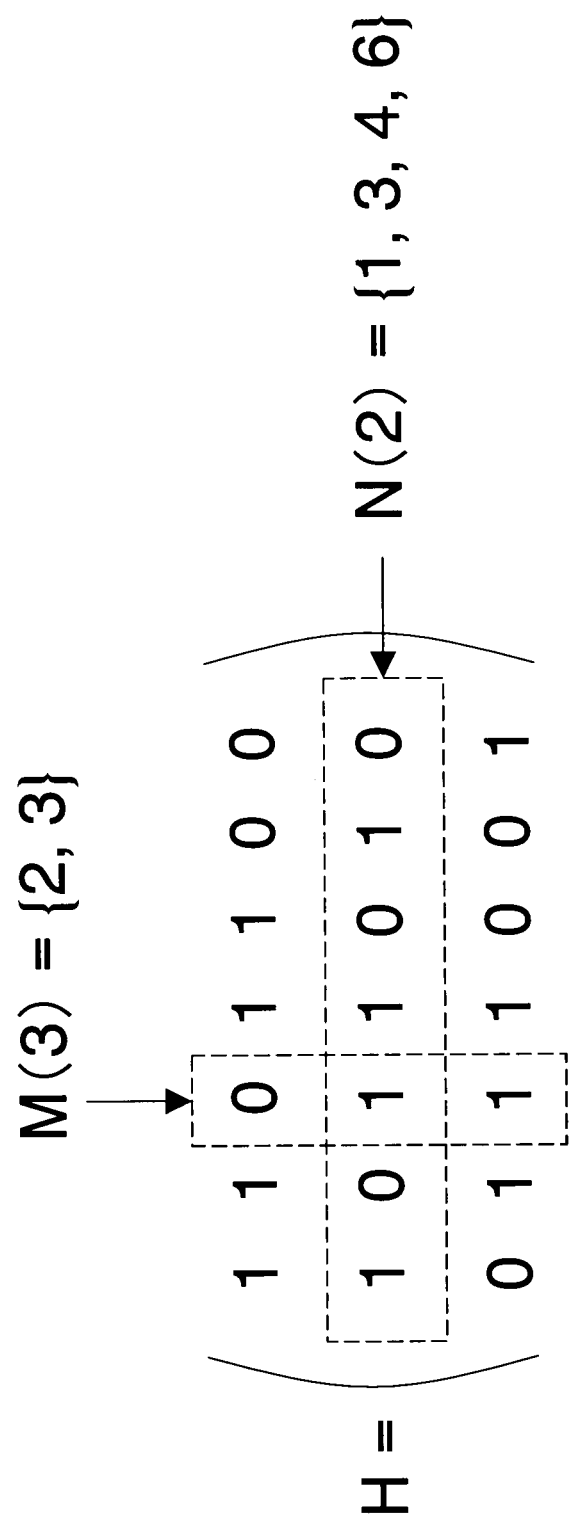
FIG. 3 shows an example of a parity check matrix H.

As shown in FIG. 3, a first error correction unit 105 preliminarily holds the parity check matrix H. Each row of the parity check matrix H is referred to as "parity check equation". In FIG. 3, the parity check matrix H has three rows and seven columns. In other word, three parity check equations exist in the parity check matrix H.

If the error is found in the ECC frame by the parity check, the decoding process is performed as described below. The first error correction unit 105 performs the error correction for the ECC frame according to the first iterative decoding algorithm using the message having smaller number of quantization bits such as 1-bit or 2-bit.

In the first embodiment, the first iterative decoding algorithm using the message having length of 2-bit (hereinafter, referred to as "2-bit decoding algorithm") will be explained below. In the 2-bit decoding algorithm, number of the messages equals to number of the elements of "1" in the parity check matrix H having M rows and N columns. For example, the messages are expressed by following expressions (2), (9), (10) and (12). In these expressions, the ECC frame is the encoded bit sequence having length of N-bit. The message expressed as the expression (2) is given by the expression (1). According to the expression (1), the message expressed as the expression (2) is a set of an upper bit expressed by the expression (3) and a lower bit expressed by the expression (4). An index "i" is number of iteration (that is, number of performing the decoding processes per row and column). This means that each massage may be different value in each of iteration. "m" is row number of the parity check matrix H and fills m={1,2, ..., M}. "n" is column number of the parity check matrix H and fills n={1,2, ..., N}.

$$z_{mn}^{i} = \{z_{mn}^{i,MSB}, z_{mn}^{i,LSB}\} \quad (1)$$

$$z_{mn}^{i} \quad (2)$$

$$z_{mn}^{i,MSB} \quad (3)$$

$$z_{mn}^{i,LSB} \quad (4)$$

If the ECC frame is inputted into the first error correction unit 105, all massages are calculated according to the expression (5). The message expressed as the expression (6) is given by the expression (5). According to the expression (5), the message expressed as the expression (6) is a set of an upper bit and a lower bit. The upper bit equals to n-th bit "bn" of the ECC frame. The lower bit equals to "0". The lower bit shows accuracy of the upper bit. Specifically, the lower bit of "0" means that the upper bit has high accuracy. On the other hand, the lower bit of "1" means that the upper bit has low accuracy.

$$z_{mn}^{0} = \{b_n, 0\} \quad (5)$$

$$z_{mn}^{0} \quad (6)$$

In the decoding process for LDPC codes, the decoding process is first performed in rows (hereinafter, "row process") and then performed in columns (hereinafter, "column process") in the parity check matrix H. These row process and column process are iteratively performed to decode the ECC frame.

Next, we will explain i-th row process and i-th column process in the iteration of the 2-bit decoding algorithm. The row process is separately performed for the upper bit and the lower bit according to the expression (7) and the expression (8) to obtain the messages expressed as the expression (9) and the expression (10), respectively. The expression (7) and the expression (8) are performed for all "m" or all "n". Then, the messages corresponding to the elements of "1" in the parity check matrix H are calculated.

$$r_{mn}^{i-1,MSB} = \sum_{n' \in N(m) \setminus n} z_{mn'}^{i-1,MSB} \quad (7)$$

$$r_{mn}^{i-1,LSB} = \sum_{n' \in N(m) \setminus n} z_{mn'}^{i-1,LSB} \quad (8)$$

$$r_{mn}^{i-1,MSB} \quad (9)$$

$$r_{mn}^{i-1,LSB} \quad (10)$$

In the expressions (7) and (8), "N(m)" is a set of column numbers which achieve that value of the parity check equation is "1" in the m-th row of the parity check matrix H. "N(m)\n" is a subset of the N(m) except n-th column. For example, in the FIG. 3, N(2)={1, 3, 4, 6}, N(2)\3={1, 4, 6}.

The row process is performed for each bit, that is the upper bit and the lower bit. Therefore, the expressions (5) and (6) are easily calculated by exclusive OR and AND.

After completing the row process, the column process is performed according to the expression (11) to calculate the message expressed as the expression (12).

$$q_{mn}^{i} = w^{i-1}(1 - 2b_n) + \sum_{m' \in M(n) \setminus m} \left(1 + r_{m'n}^{i-1,LSB}\right)\left(1 - 2r_{m'n}^{i-1,MSB}\right) \quad (11)$$

$$q_{mn}^{i} \quad (12)$$

In the expression (11), "M(n)" is a set of row numbers which achieve that the value of the parity check equation is "1" in the n-th column of the parity check matrix H. "M(n)\m" is a subset of the M(n) except m-th row. For example, in the FIG. 3, M(3)={2, 3}, M(2)\2={3}.

"$w^i$" is a weight for the bit "bn". If the "$w^i$" is different value in each of iteration, performance of the decoding can be improved compared with fixed value. For example, in the case that the "$w^i$" is 2 when i<5 and the "$w^i$" is 1 when i≥5, error floor is reduced compared with the case that the "$w^i$" is always 2. The "$w^i$" is experimentally determined to satisfy requirement of a system.

Next, the message expressed as the expression (15) is calculated using the message expressed as the expression (12) according to the expressions (13) and (14).

$$z_{mn}^{i} = \psi(q_{mn}^{i}) \quad (13)$$

$$\psi(q^i_{mn}) = \begin{cases} \{0,1\} & \text{if } q^i_{mn} \geq 2, \\ \{0,0\} & \text{if } q^i_{mn} = 1, \\ \{b_n, 0\} & \text{if } q^i_{mn} = 0, \\ \{1,0\} & \text{if } q^i_{mn} = -1, \\ \{1,1\} & \text{otherwise.} \end{cases} \quad (14)$$

$$z^i_{mn} \quad (15)$$

In the iterative decoding algorithm for LDPC codes, the message is further updated by performing the row and column processes iteratively using the message expressed as the expression (15).

Decoded bits expressed as the expression (16) are calculated by the expressions (17) and (18). The "N" decoded bits respectively correspond to bits included in the ECC frame. Corrected ECC frame is formed from the "N" decoded bits. Every end of the row and column processes, the parity check is performed for the ECC frame formed from the "N" decoded bits.

$$\hat{b}^i_n \quad (16)$$

$$\hat{b}^i_n = \begin{cases} 0 & \text{if } q^i_n > 0, \\ b_n & \text{if } q^i_n > 0, \\ 1 & \text{otherwise.} \end{cases} \quad (17)$$

$$q^i_n = w^{i-1}(1 - 2b_n) + \sum_{m \in M(n)} (1 + r^{i-1,LSB}_{mn})(1 - 2r^{i-1,MSB}_{mn}) \quad (18)$$

The row and column processes are iteratively performed until the all elements of the syndrome becomes zero (this means satisfying the parity check), or until number of the iteration reaches to a number determined preliminarily. If the parity check is not satisfied after the i-th row and column processes, the (i+1)th row and column processes are performed. If the parity check has not been satisfied until number of the iteration reaches to the number determined preliminarily, the error collection may be failed.

In the first embodiment, the 2-bit decoding algorithm is applied as the first iterative decoding algorithm. However, the first iterative decoding algorithm is not limited to the 2-bit decoding algorithm and can be other decoding algorithm, for example, a bit flip decoding algorithm using a message of 1-bit or Gallager's algorithm.

Next, we will explain the decoding process at the second error correction unit 106. The second error correction unit 106 performs the error correction for the ECC frame which is not corrected the error by the first error correction unit 105. The error correction in the second error correction unit 106 is performed according to the second iterative decoding algorithm using a message having a larger number of quantization bits than that of the first iterative decoding algorithm. The second error correction unit 106 preliminarily holds the parity check matrix H which is same as the first error correction unit 105.

As the second iterative decoding algorithm, a min-sum decoding algorithm (hereinafter, referred to as "min-sum algorithm") will be explained below. The min-sum algorithm usually uses the messages having length of more than 3-bits. A log likelihood ratio (LLR) which is an initial message is calculated using bits included in the ECC frame according to the expression (19). The LLR is a logarithmic value of ratio between a probability Pr(bn=0) and a probability Pr(bn=1).

The probability Pr(bn=0) is a probability that n-th bit of the ECC frame is "0". Similarly, the probability Pr(bn=1) is a probability that n-th bit of the ECC frame is "1".

$$z^0_{mn} = \ln\left(\frac{Pr(b_n = 0)}{Pr(b_n = 1)}\right) \quad (19)$$

"ln" means a natural logarithmic function having a base of Napier's number. In the first embodiment, each data of 1-bit (that is "0" or "1") included in the ECC frame is inputted into the second error correction unit 106 in order of the data. The probability Pr(bn=0) of the data "0" being inputted and the probability Pr(bn=1) of the data "1" being inputted are preliminarily set to the second error correction unit 106.

The i-th row and column processes in the min-sum algorithm are described below. The row process is performed before the column process. The row process is performed according to the following expression (20).

$$r^{j-1}_{mn} = \prod_{n' \in N(m)\backslash n} \text{sign}(z^{j-1}_{mn'}) \times \min(|z^{j-1}_{mn'}|) \quad (20)$$

In the expression (20), sign (Zmn−) is a function to obtain a sign of Zmn− (That is "+1" or "−1"). Also, min(Zmn−) is a function to obtain a minimum |Zmn−| from the subset N(m)\n of the column number.

The column process is performed after completing the row process. In the column process, the message is calculated according to the following expression (21).

$$z^i_{mn} = z^0_{mn} + \sum_{m' \in M(n)\backslash m} r^{j-1}_{m'n} \quad (21)$$

The second error correction unit 106 calculates the decoded bits expressed as the expression (16) according to the expressions (17) and (22). Next, the ECC frame is formed from the decoded bits obtained through the i-th row and column processes. Then, the parity check is performed for the ECC frame. If it is determined that the ECC frame has no error by the parity check, this means that the decoding process is completed. At last, the information data of the ECC frame is outputted to the host bus 107. On the other hand, if it is determined that the ECC frame has the error by the parity check, the (i+1) row and the column processes are performed.

$$q^i_n = z^0_{mn} + \sum_{m \in M(n)} r^{j-1}_{mn} \quad (22)$$

In the first embodiment, the min-sum algorithm are applied as the second iterative decoding algorithm. However, the second iterative decoding algorithm is not limited to the min-sum algorithm and can be other decoding algorithm which uses a message having a larger number of quantization bits than that of the first iterative decoding algorithm. For example, the second iterative decoding algorithm may be an improved min-sum algorithm in which the multiplying message obtained by the row process by a coefficient. Or, the second iterative decoding algorithm may be a sum product algorithm which can calculate probability more accurately.

Hereinafter, we will explain process of the error correction for the ECC frame in the error correction device 150 with reference to the FIG. 1. The control unit 104 instructs the memory interface 102 to read the page data including the ECC frames from the flash memory 101. The page data read from the flash memory 101 is outputted to the read buffer 103 and stored in the read buffer 103. Then, the control unit 104 instructs the read buffer 103 to output the ECC frame to the first error correction unit 105 at certain timing.

The first error correction unit 105 corrects the error of the ECC frame according to the decoding algorithm described above. After the first error correction unit 105 completes the error correction for the ECC frame, the first error correction unit 105 removes the parity data from the ECC frame and output the information data in the ECC frame to the host bus 107. The first error correction unit 105 informs completion of the error correction for the ECC frame to the control unit 104. If the control unit 104 receives the completion of the error correction, the control unit 104 recognizes that the first error correction unit 105 is in a wait state. Then, the control unit 104 instructs the read buffer 103 to supply a next ECC frame to the first error correction unit 105. The control unit 104 also instructs the read buffer 103 to discard the ECC frame which is completed the error correction.

If the first error correction unit 105 fails the error correction for the ECC frame, the first error correction unit 105 discards the ECC frame and informs failure of the error correction to the control unit 104. If the control unit 104 receives the failure of the error correction, the control unit 104 instructs the read buffer 103 to output the failed ECC frame to the second error correction unit 106 and to supply a next ECC frame to the first error correction unit 105.

If the first error correction unit 105 fails the error correction for the ECC frame, the first error correction unit 105 informs failure of the error correction to the control unit 104. The failed ECC frame in the first error correction unit 105 is inputted into the second error correction unit 106 from the read buffer 103. The second error correction unit 106 tries to correct the error according to the second iterative decoding algorithm. After the second error correction unit 106 completes the error correction for the ECC frame, the second error correction unit 106 removes the parity data from the ECC frame and output the information data in the ECC frame to the host bus 107. Then, the second error correction unit 106 informs completion of the error correction for the ECC frame to the control unit 104.

If the control unit 104 receives the completion of the error correction, the control unit 104 instructs the read buffer 103 to discard the ECC frame completed the error correction. Moreover, the control unit 104 recognizes that the second error correction unit 106 is in a wait state.

Then, the control unit 104 instructs the host bus 107 to output the decoded information data held in the host bus 107 at certain timing of a following signal processing unit (not shown).

According to the first embodiment, the nonvolatile semiconductor memory system 100 includes the first and second error correction units 105, 106 which correct the error using the messages having different number of quantization bits, respectively. The second error correction unit 106 has higher ability of the error correction than that of the first error correction unit 105, because the second error correction unit 106 has a larger number of quantization bits than that of the first error correction unit 105. Moreover, the second error correction unit 106 decodes the ECC frame which is failed to correct the error by the first error correction unit 105. Therefore, the nonvolatile semiconductor memory system 100 reduces the power consumption for performing the error correction with keeping high error correction ability.

In the first embodiment, the first and second error correction units 105, 106 is provided separately. However, the first and second error correction units 105, 106 may share a circuit and memory to store the messages. In this case, the message used in the first error correction unit 105 may be expressed as lower or upper bits of the message used in the second error correction unit 106, because the message used in the first error correction unit 105 has less bits than the message used in the second error correction unit 106.

If the first error correction unit 105 once fails to correct error in an ECC frame, the first error correction unit 105 again fails to correct the error in the ECC frame. Then, the second error correction unit 106 may correct the error in the ECC frame. Therefore, the control unit 104 memorizes the page data including the ECC frame and frame number of the ECC frame after the first error correction unit 105 first fails to correct the error. In this case, the control unit 104 may control the read buffer 103 to input the ECC frame into the second error correction unit 106 without inputting it into the first error correction unit 105, after the first error correction unit 105 once fails to correct the error. The nonvolatile semiconductor memory system 100 in this case can correct the error more efficiently, because the ECC frame failed by the first error correction unit 105 is tried to correct the error by the second error correction unit 106 without going through the first error correction unit 105 again.

Moreover, the errors will be concentrated in a frame number of a block, because failure of the flash memory 101 is tend to be disproportionate in a block or plane. Therefore, when the page data in a block are read sequentially, if the first error correction unit 105 fails to correct errors for an ECC frame in a page data, the second error correction unit 106 may try to correct the errors for a next ECC frame in a following page data without through the first error correction unit 105. This leads to correct the errors more efficiently.

Figure 4:
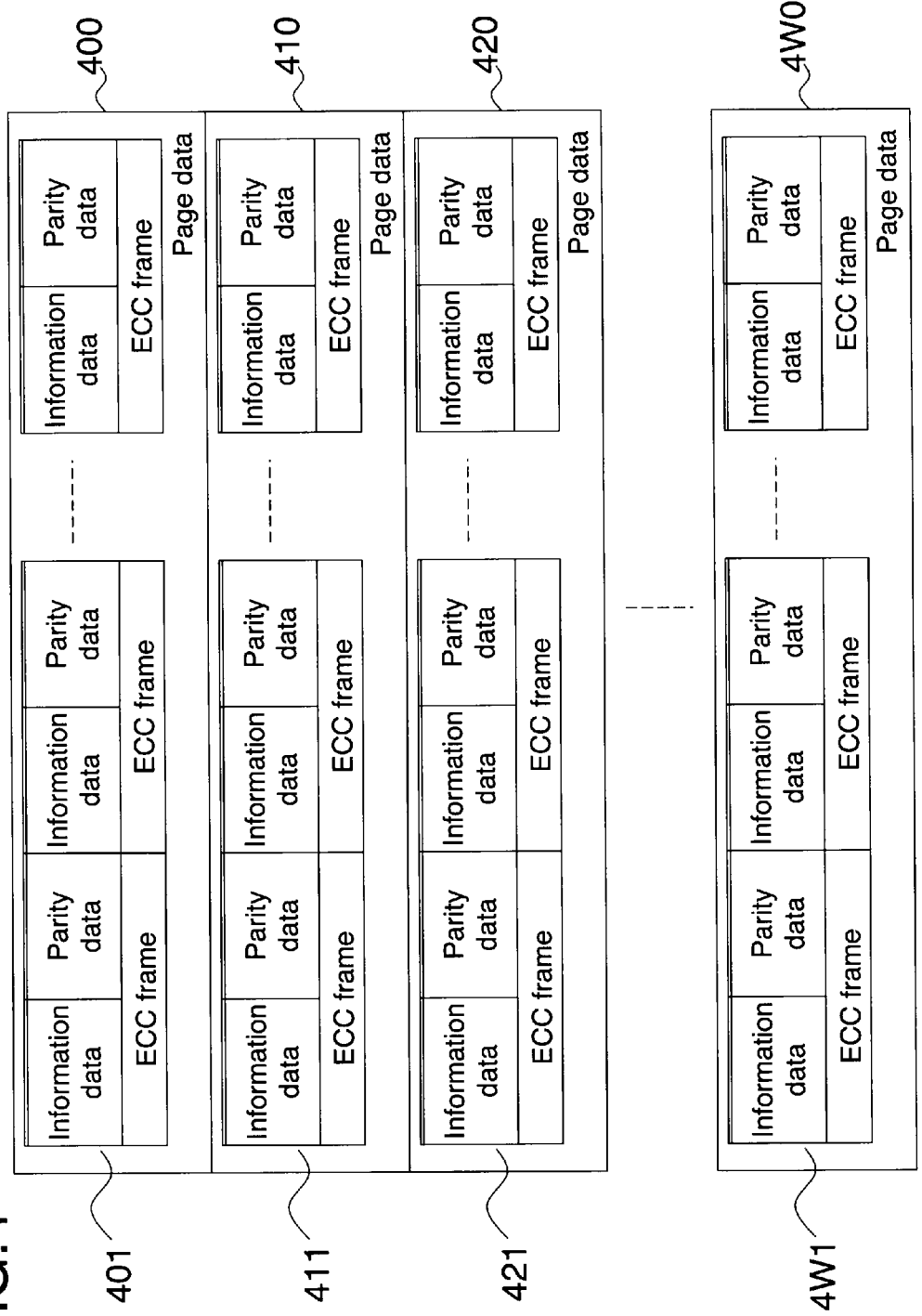
FIG. 4 shows a structure of a block including plural page data.

As shown in FIG. 4, an example case that plural page data 400 to 4W0 in a block are read sequentially, is considered. If the first error correction unit 105 fails to correct the error for a first ECC frame 401 in the page data 400, the second error correction unit 106 tries to correct the errors for the first ECC frames 411-4W1 in following the page data 410-4W0 instead of the first error correction unit 105.

Description of the Second Embodiment

Figure 5:
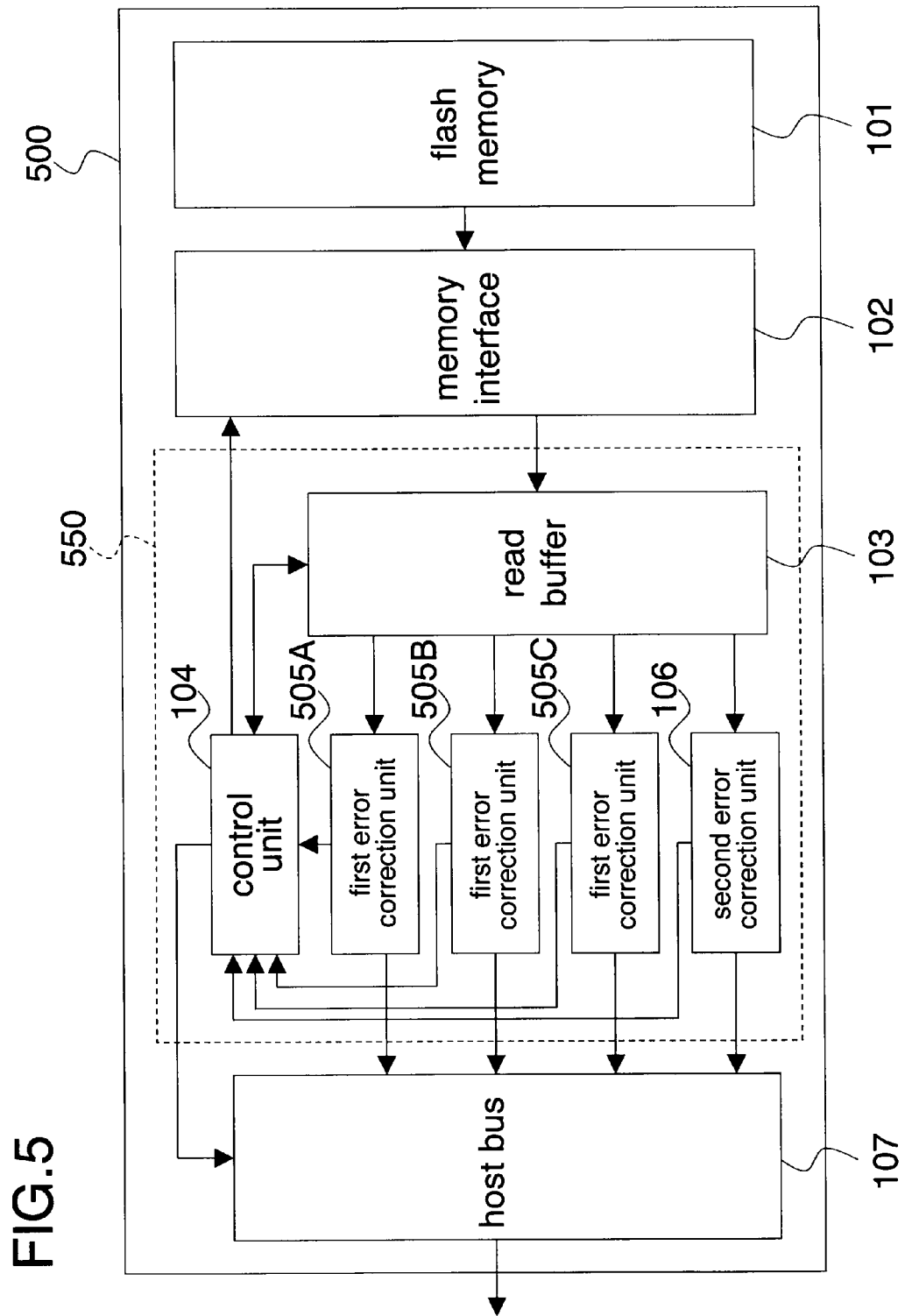
FIG. 5 is a block diagram of a nonvolatile semiconductor memory system according to the second embodiment.

A nonvolatile semiconductor memory system 500 according to the second embodiment will be explained with reference to FIG. 5. In FIG. 5, same components are expressed by same number as them of the nonvolatile semiconductor memory system 100 shown in FIG. 1. Moreover, explanations of the same components are skipped in the second embodiment. As shown in FIG. 5, the nonvolatile semiconductor memory system 500 includes the flash memory 101, the memory interface 102, an error correction device 550 and the host bus 107. The error correction device 550 is different from that of the nonvolatile semiconductor memory system 100 shown in FIG. 1. The error correction device 550 includes a read buffer 103, a control unit 104, plural first error correction units 505A, 505B, 505C, and a second error correction unit 106. While only one first error correction unit 505 exists in the first embodiment, the plural first error correction units 505A, 505B, 505C are arranged in parallel in the second embodiment. Each of the first error correction units 505A, 505B, 505C is same as the first error correction units 105. Number of the first error correction units 505 and number of the second error correction units 106 are not limited to tree and one, respectively. However, number of the second error correction units 106 is better to be equal or less than number of the first error correction units 505. Number of the first error correction units 505 and number of the second error correction units 106 may be determined according to a specification required by a system.

In the second embodiment, the control unit 104 instructs the read buffer 103 to input the ECC frame to one of the first error correction units 505A, 505B, 505C which is in the waiting state. In the second embodiment, error corrections for the plural ECC frames are performed by the first error correction units 505A, 505B, 505C in parallel. If each of the first error correction units 505A, 505B, 505C fails to correct the error of the ECC frame, the second error correction unit 106 tries to correct the error of the ECC frame as same as the first embodiment.

It is important for the nonvolatile semiconductor memory system to achieve fast reading the data. In general, the nonvolatile semiconductor memory system realizes the fast reading by parallelized the error correction unit and the flash memory. On the other hand, size of circuit becomes larger and power consumption is also larger. The nonvolatile semiconductor memory system 500 has more number of the first error correction units 505 than number of the second error correction units 106. Because the first error correction unit 505 has smaller size of circuit and is more frequently used than them of the second error correction unit 106, the nonvolatile semiconductor memory system 500 can reduce the power consumption with keeping high error correction ability.

Description of the Third Embodiment

Figure 6:
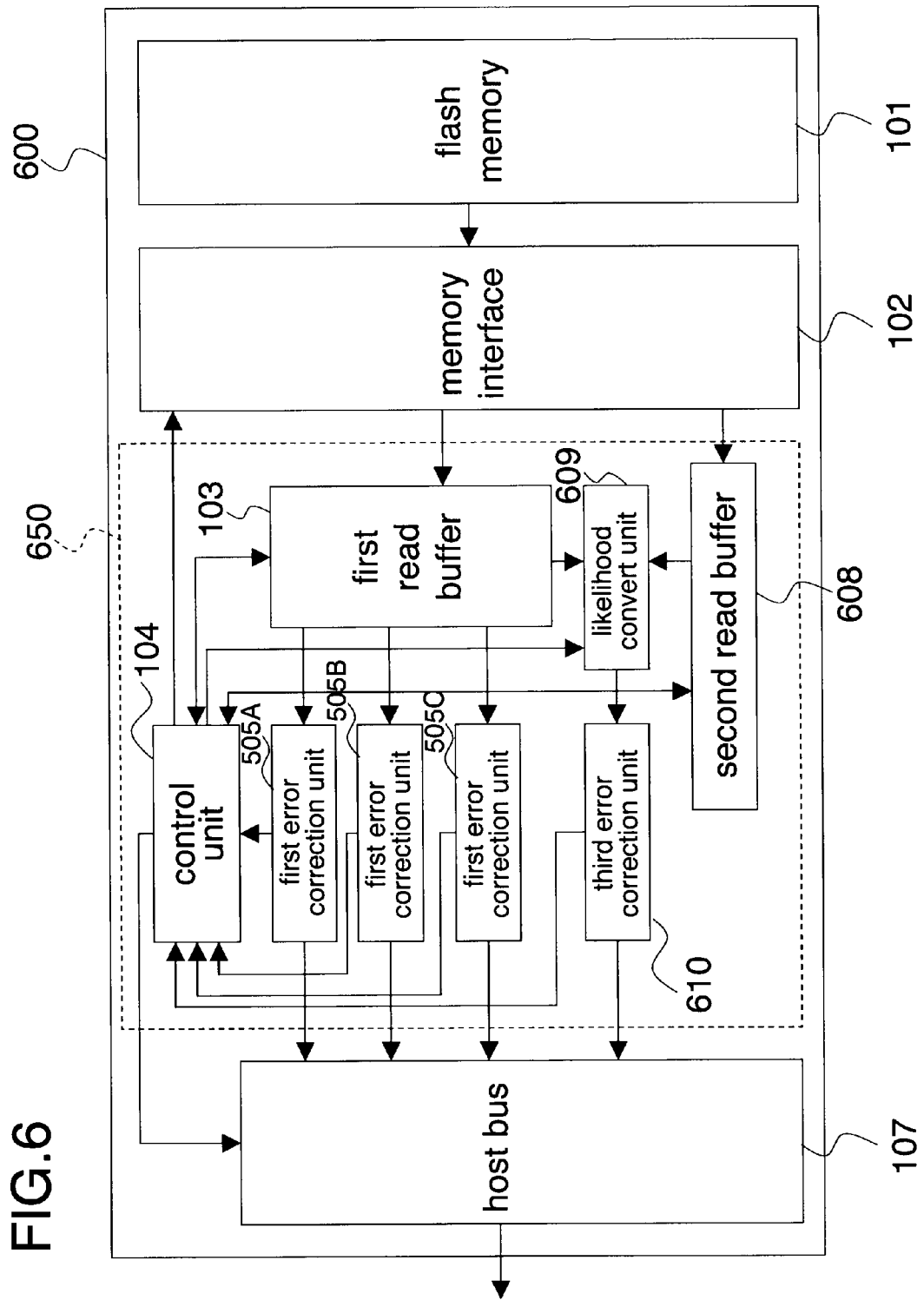
FIG. 6 is a block diagram of a nonvolatile semiconductor memory system according to the third embodiment.

A nonvolatile semiconductor memory system 600 according to the third embodiment will be explained with reference to FIG. 6. In FIG. 6, same components are expressed by same number as them of the nonvolatile semiconductor memory system 600 shown in FIG. 6. Moreover, explanations of the same components are skipped in the second embodiment.

As shown in FIG. 6, the nonvolatile semiconductor memory system 600 includes the flash memory 101, the memory interface 102, an error correction device 650 and the host bus 107. The error correction device 650 is different from that of the nonvolatile semiconductor memory system 100 shown in FIG. 1. The error correction device 650 includes the first read buffer 103, the control unit 104, plural first error correction units 505A, 505B, 505C, a second read buffer 608, a likelihood convert unit 609 and a third error correction unit 610. In the third embodiment, the error correction device 650 has the third error correction unit 610 instead of the second error correction unit 106 of the first and second embodiments. The third error correction unit 610 performs the error correction according to the third iterative decoding algorithm. The third iterative decoding algorithm uses soft-decision values obtained from the memory cell. The soft-decision value is a data obtained by judging threshold voltage of each of the memory cells. Each memory cell is corresponding to each bit of the ECC frame.

In the case of the memory cell stores data of p-bit, the memory cell has "$2^p$" threshold voltages Vth. The data can be read by either of two methods, that is hard-decision or soft-decision. In the hard-decision, judging the threshold voltages Vth is repeated ($2^p-1$) times to read the data from the memory cell. On the other hand, in the soft-decision, judging the threshold voltages Vth is repeated more than $2^p$ times to obtain a detailed threshold voltage. The data read by the hard-decision is called as a hard bit (HB) or a hard-decision value. Similarly, the data read by the soft-decision is called as a soft bit (SB) or the soft-decision value. The soft-decision value may show accuracy of the hard-decision value. The threshold voltage Vth for the soft-decision is more segmentalized than them for the hard-decision. In the third embodiment, reading the ECC frame means reading the hard-decision value.

Figure 7:
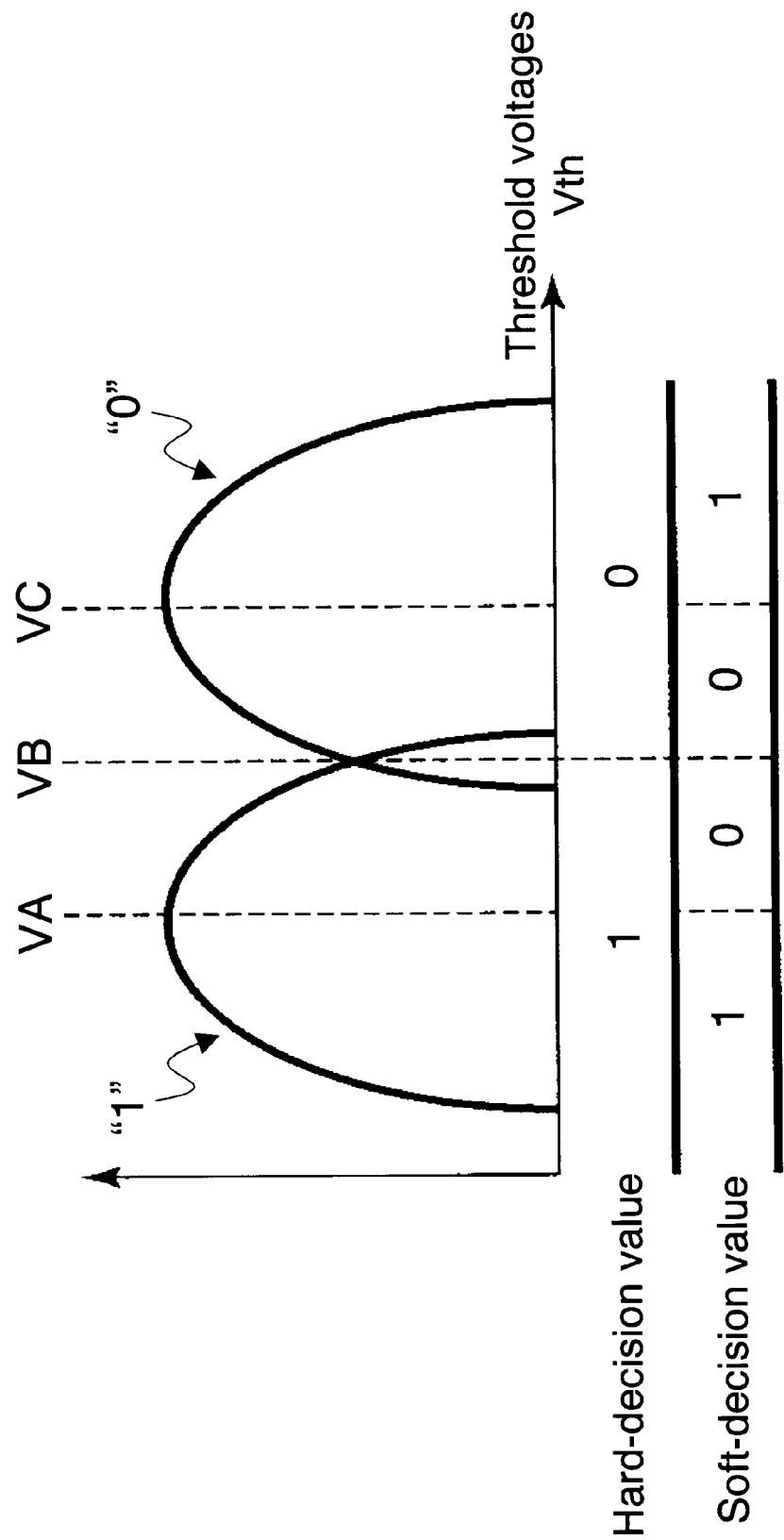
FIG. 7 is a figure explaining a soft-decision value and a hard-decision value.

FIG. 7 is a figure showing an example of spectrum of the threshold voltage Vth when the memory cell stores data of 1-bit. In FIG. 7, the memory cell stores the data "1" when the threshold voltage Vth is smaller than VB, and the memory cell stores the data "0" when the threshold voltage Vth is larger than VB. In the hard-decision, the data in the memory cell ("1" or "0") is read out by judging whether or not the threshold voltage Vth is smaller than VB. If the memory cell stores the data "1", the threshold voltage Vth is further judged whether or not the threshold voltage Vth is smaller than VA, or larger than VA and smaller than VB, by performing the soft-decision after the hard-decision. If the threshold voltage Vth is smaller than VA, the soft-decision value is the data "1". If the threshold voltage Vth is larger than VA and smaller than VB, the soft-decision value is the data "0". When the memory cell stores the data "0", the flash memory 101 judges the threshold voltage Vth is larger than VB and smaller than VC, or the threshold voltage Vth is larger than VC. If the threshold voltage Vth is larger than VB and smaller than VC, the soft-decision value is the data "0". If the threshold voltage Vth is larger than VC, the soft-decision value is the data "1". The soft-decision value of "1" means that the hard-decision value has the high accuracy. On the other hand, the soft-decision value of "0" means that the hard-decision value has the low accuracy.

In the case of the memory cell storing larger number of bits, range of the threshold voltages Vth becomes narrower. Therefore, error rate increases when the data is wrote to the memory cell and when the data is read from the memory cell. In the third embodiment, the error in the ECC frame can be corrected with higher accuracy by using the soft-decision value for calculation of the LLR. The LLR shows accuracy of bit which is read from the memory cell.

If each of the first error correction units 505A, 505B, 505C fails to correct the error of the ECC frame, the control unit 104 instructs the memory interface 102 to read the soft-decision value from the memory cell. Then, the memory interface 102 outputs the soft-decision value to the second read buffer 608. The soft-decision value is temporarily stored in the second read buffer 608. The control unit 104 instructs the second read buffer 608 to output the soft-decision value to the likelihood convert unit 609. Also, the control unit 104 instructs the first read buffer 103 to output the ECC frame to the likelihood convert unit 609, which the ECC frame is failed the error correction by the first error correction units 505A, 505B, 505C. The likelihood convert unit 609 receives the ECC frame from the first read buffer 103 and the soft-decision value corresponding to the ECC frame from the second read buffer 608.

In FIG. 6, the soft-decision value is stored in the second read buffer 608 and the hard-decision value is stored in the first read buffer 103. The soft-decision value and hard-decision value are supplied to the likelihood convert unit 609. However, the hard-decision may be re-calculated by re-performing the hard-decision, when the soft-decision value is obtained. In this case, the hard-decision value and the soft-decision value may be stored together in the second read buffer 608. The likelihood convert unit 609 may receives both the hard-decision value and the soft-decision value from the second read buffer 608 without receiving them from the first read buffer 103.

The likelihood convert unit 609 converts the ECC frame and the soft-decision value of the ECC frame to the LLR according to the expression (19). The likelihood convert unit 609 outputs the LLR to the third error correction unit 610. The third error correction unit 610 performs the error correction for the ECC frame according to the decoding algorithm using the message having the larger number of quantization bits than that of the first error correction units 505A, 505B, 505C. For example, the decoding algorithm may be the second iterative decoding algorithm described in the first embodiment. Note that, in the third embodiment, the third error correction unit 610 skips calculation of LLR expressed by the expression (19) in the second iterative decoding algorithm, because the third error correction unit 610 obtains the LLR from the likelihood convert unit 609.

Number of the first error correction units 505 and number of the third error correction units 610 are respectively not limited to tree and one as shown in FIG. 6. However, number of the third error correction units 610 is better to be equal or less than number of the first error correction units 505. Number of the first error correction units 505 and number of the third error correction units 610 may be determined according to a specification required by the system.

Figure 8:
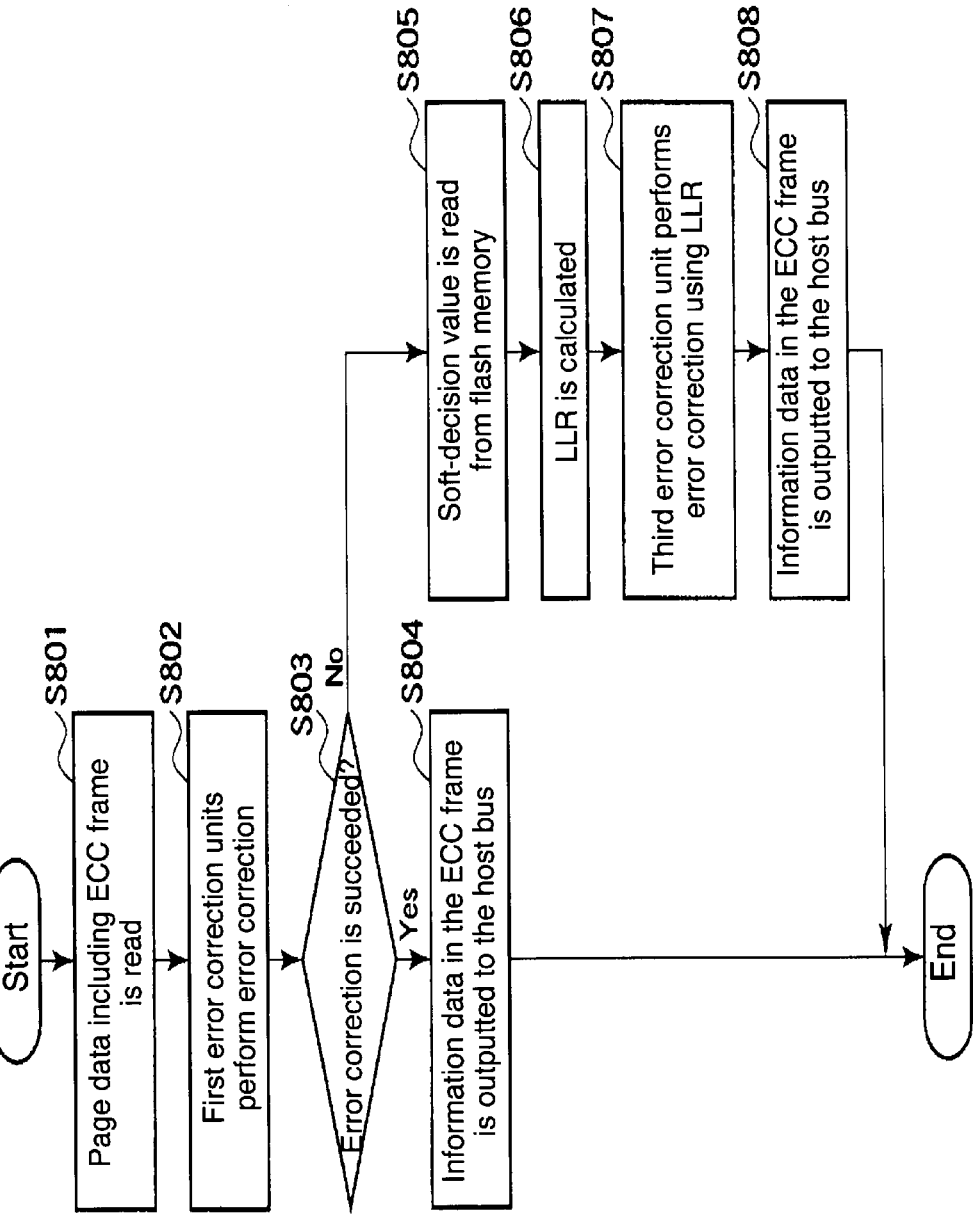
FIG. 8 is a flow chart explaining operation of the error correction for an ECC frame.

FIG. 8 is a flow chart explaining operation of the error correction for the ECC frame in the error correction device 650. In the step S801, the memory interface 102 reads the page data including at least one ECC frame from the memory cell of the flash memory 101. The memory interface 102 performs the hard-decision in order to read the page data.

In the step S802, the control unit 104 instructs the memory interface 102 to supply the ECC frame to each of the first error correction units 505A, 505B, 505C. Each of the first error correction units 505A, 505B, 505C performs the parity check and correct the error of the ECC frame. In the step S803, the error correction device 650 determines whether or not each of the first error correction units 505A, 505B, 505C completes the error correction. If each of the first error correction units 505A, 505B, 505C succeeds the error correction, each of the first error correction units 505A, 505B, 505C removes the parity data from the ECC frame and output the information data in the ECC frame to the host bus 107 in the step S804. Moreover, each of the first error correction units 505A, 505B, 505C informs completion of the error correction to the control unit 104.

On the other hand, if any of the first error correction units 505A, 505B, 505C fail the error correction in the step S803, the memory interface 102 reads the soft-decision value from the memory cell holding the ECC frame in the step S805. Then, the likelihood convert unit 609 calculates the LLR due to the failed ECC frame and the soft-decision value in the step S806.

In the step S807, the third error correction unit 610 performs the error correction for the ECC frame based on the LLR. If the third error correction unit 610 succeeds the error correction, the third error correction unit 610 removes the parity data from the ECC frame and output the information data in the ECC frame to the host bus 107 in the step S808. Moreover, the third error correction unit 610 informs completion of the error correction to the control unit 104. The control unit 104 instructs the read buffer 103, the second read buffer 608 and the likelihood convert unit 609 to discard the ECC frame for which the error correction is completed. Then, the decoding process has finished.

According to the third embodiment, the nonvolatile semiconductor memory system 600 can correct the error of the ECC frame with higher accuracy by using the soft-decision value obtained from the memory cell with LDPC codes.

If number of "1" included in the syndrome (hereinafter, referred to as "syndrome weight") is larger than a certain number when each of the error correction units 505A, 505B, 505C performs the parity check for the ECC frame, the control unit 104 may instruct the error correction device 650 to perform the error correction at the third error correction unit 610 instead of the first error correction units 505A, 505B, 505C.

Description of the Fourth Embodiment

Figure 9:
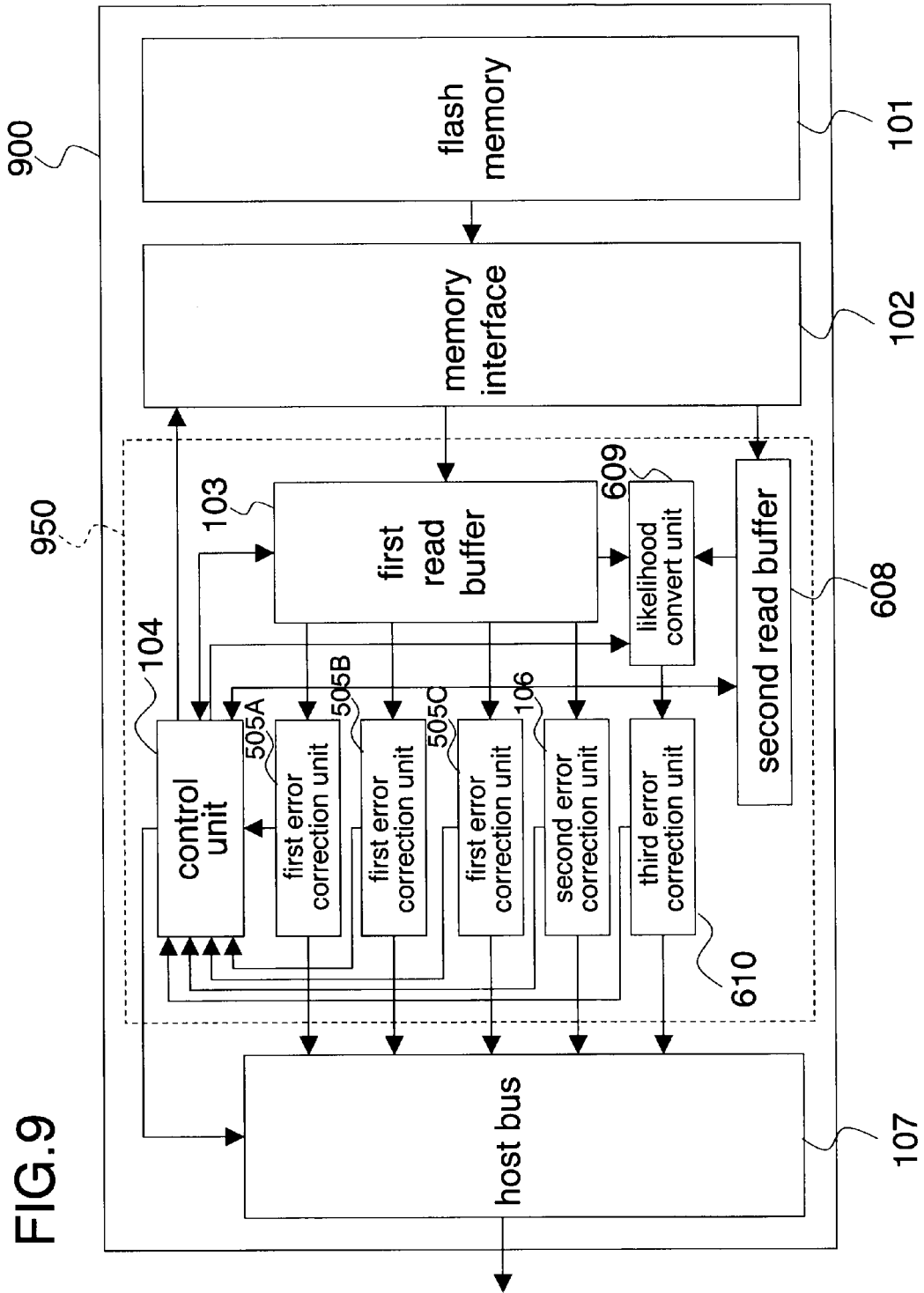
FIG. 9 is a block diagram of a nonvolatile semiconductor memory system according to the fourth embodiment.

A nonvolatile semiconductor memory system 900 according to the fourth embodiment will be explained with reference to FIG. 9. In FIG. 9, same component are expressed by same number as them of the nonvolatile semiconductor memory systems 100, 500, 600 shown in FIGS. 1, 5, 6. Moreover, explanations of the same components are skipped in the second embodiment. As shown in FIG. 9, the nonvolatile semiconductor memory system 900 includes the flash memory 101, the memory interface 102, an error correction device 950 and the host bus 107. The error correction device 950 is different from that of other embodiments. The error correction device 950 includes the first read buffer 103, the control unit 104, the plural first error correction units 505A, 505B, 505C, the second error correction unit 106, the third error correction unit 610, the second read buffer 608, and the likelihood convert unit 609. The first error correction units 505A, 505B, 505C are same as them of the second and third embodiments. The second error correction unit 106 is same as that of the first and second embodiments. The third error correction unit 610, the second read buffer 608, and the likelihood convert unit 609 are same as them of the third embodiment.

In the error correction device 950, each of the first error correction units 505A, 505B, 505C performs the error correction according to the first iterative decoding algorithm. The second error correction unit 106 performs the error correction according to the second iterative decoding algorithm using a message having a larger number of quantization bits than that of the first iterative decoding algorithm. The third error correction unit 610 performs the error correction using the soft-decision value according to the third iterative decoding algorithm using a message having equal or larger number of quantization bits compared with the second iterative decoding algorithm.

Number of the first error correction units 505, number of the second error correction unit 106, and number of the third error correction units 610 are respectively not limited to tree, one, and one as shown in FIG. 9. However, number of the second error correction units 106 is better to be equal or less than number of the first error correction units 505. Similarly, number of the third error correction units 610 is better to be equal or less than number of the second error correction units 106. Number of the first error correction units 505, number of the second error correction units 106, and number of the third error correction units 610 may be determined according to a specification required by the system.

Figure 10:
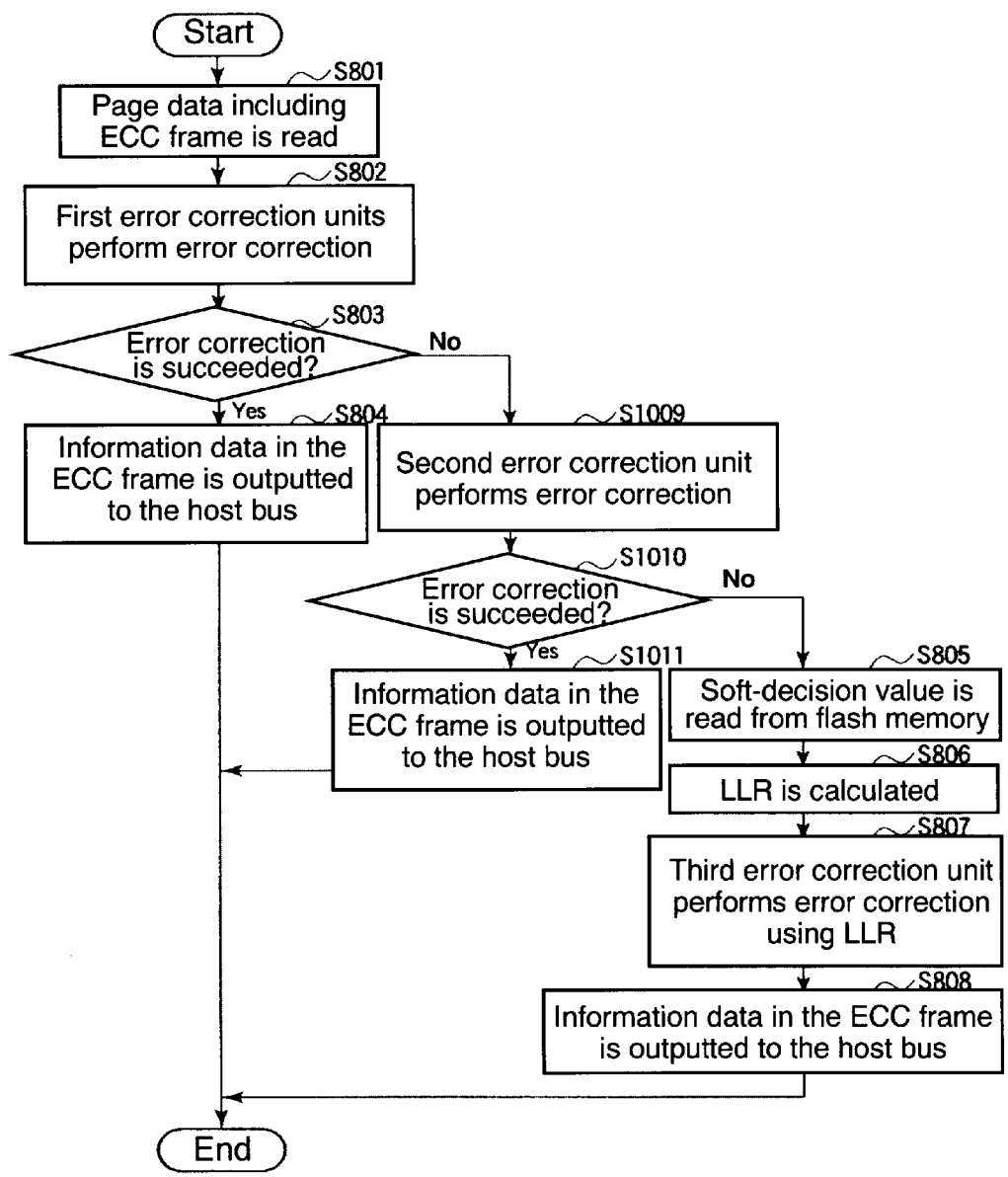
FIG. 10 is a flow chart explaining operation of the error correction for an ECC frame.

FIG. 10 is a flow chart explaining operation of the error correction for the ECC frame in the error correction device 950. In FIG. 10, the same operations as them described in FIG. 8 are referring to the same number as FIG. 8, and their explanations are skipped.

If any of the first error correction units 505A, 505B, 505C fail to correct the error of the ECC frame the step S803, the ECC frame is outputted to the second error correction unit 106. Then, the second error correction unit 106 tries to correct the error of the ECC frame in the step S1009.

In the step S1010, it is checked whether or not the second error correction unit 106 succeeds the error correction. If the second error correction unit 106 succeeds the error correction (in "Yes" of the step S1010), the second error correction unit 106 removes the parity data from the ECC frame and output the information data in the ECC frame to the host bus 107 in the step S1011. Moreover, the second error correction unit 106 informs completion of the error correction for the ECC frame to the control unit 104. Then, the decoding process has finished.

On the other hand, if the second error correction unit 106 fails the error correction in the step S1010, the steps S805 to S808 are performed as same as the third embodiment.

Figure 11:
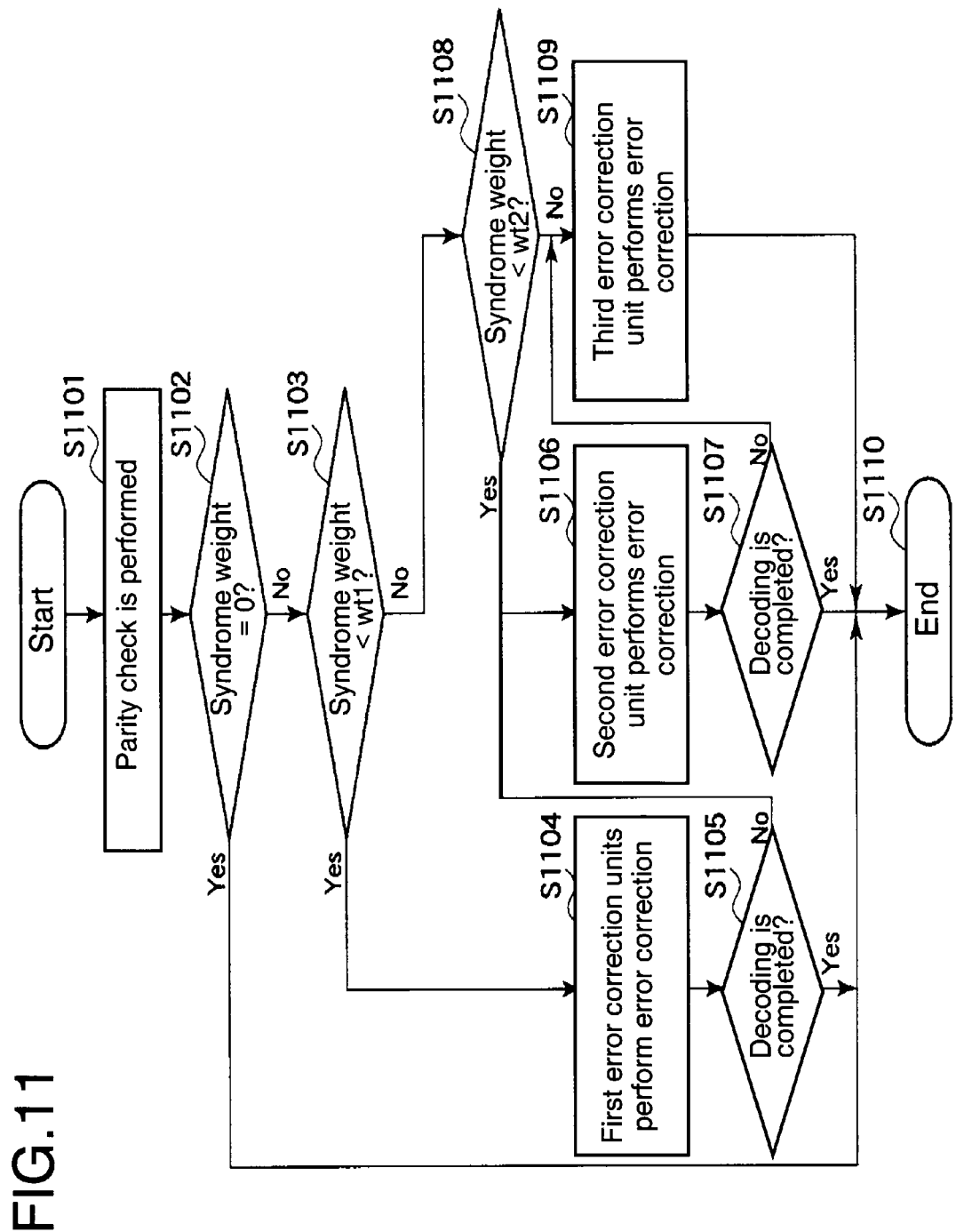
FIG. 11 is a flow chart explaining other operation of the error correction using a syndrome weight.

In the fourth embodiment, the error correction device 950 may use the syndrome weight. FIG. 11 is a flow chart explaining other operation of the error correction using the syndrome weight in the error correction device 950.

In the step S1101, each of the first error correction units 505A, 505B, 505C performs the parity check and calculation of the syndrome weight for the ECC frame. In the step S1102, each of the first error correction units 505A, 505B, 505C checks whether the syndrome weight is zero or not. If the syndrome weight is zero, the decoding process has finished in the step S1110 because the syndrome weight of zero means that the ECC frame does not include error.

On the other hand, if the syndrome weight is not zero, this means that the ECC frame includes error. In this case, each of the first error correction units 505A, 505B, 505C compares the syndrome weight with a first threshold "wt1" in the step S1103. The first threshold "wt1" is preliminarily set to each of the first error correction units 505A, 505B, 505C. If the syndrome weight is smaller than the first threshold "wt1", each of the first error correction units 505A, 505B, 505C performs the error correction for the ECC frame in the step S1104. Each of the first error correction units 505A, 505B, 505C checks whether or not the error correction is completed by the parity check in the step S1105. If it is determined that the error correction is completed, the decoding process has finished in the step S1110.

If any of the first error correction units 505A, 505B, 505C fails to correct the error of the ECC frame, the second error correction unit 106 tries to correct the error of the failed ECC frame in the step S1106. The second error correction unit 106 checks whether or not the error correction is completed by the parity check in the step S1107. If it is determined that the error correction is completed, the decoding process has finished in the step S1110.

If the second error correction unit 106 fails to correct the error of the ECC frame, the likelihood convert unit 609 reads the soft-decision value corresponding to the failed ECC frame from the flash memory 101. The likelihood convert unit 609 calculates the LLR and inputs the LLR into the third error correction unit 610. The third error correction unit 610 tries to correct the error of the failed ECC frame using the LLR. Then, the decoding process has finished in the step S1110.

If the syndrome weight is equal to or larger than the first threshold "wt1", each of the first error correction units 505A, 505B, 505C compares the syndrome weight with a second threshold "wt2" in the step S1108. If the syndrome weight is smaller than the second threshold "wt2", the second error correction unit 106 corrects the error in the step S1106. The syndrome weight is equal to or larger than the second threshold "wt2", the third error correction unit 610 corrects the error in the step S1109.

According to the decoding process shown in FIG. 11, one of the first, second, and third error correction units is selected to correct the error according to the syndrome weight. The syndrome weight is calculated by the parity check of the ECC frame. When the syndrome weight is smaller than the first threshold value "wt1", the first error correction units 505A, 505B, 505C perform the error correction. When the syndrome weight is equal to or larger than the first threshold value "wt1" and smaller than the second threshold value "wt2", the second error correction unit 106 performs the error correction. When the syndrome weight is equal to or larger than the second threshold value "wt2", the third error correction unit 610 performs the error correction. The error correction device 650 can correct the error of the ECC frame effectively by selecting one of the first, second, and third error correction units according to the syndrome weight.

In the step S1101, the control unit 104 may perform the parity check and calculate the syndrome weight instead of the first error correction units 505A, 505B, 505C.

According to the fourth embodiment, the nonvolatile semiconductor memory system 900 has more number of the first error correction units 505 than number of the second error correction units 106 or the third error correction units 610. Because the first error correction unit 505 has smaller size of circuit and is more frequently used than that of the second error correction unit 106 or the third error correction units 610, the nonvolatile semiconductor memory system 900 can reduce the power consumption for performing the error correction with keeping high error correction ability. Moreover, the nonvolatile semiconductor memory system 900 achieves fast reading of the data by the parallel processing of the first error correction units 505A, 505B, 505C.

While certain embodiments have been described, these embodiments have been presented by way of example only, and are not intended to limit the scope of the inventions. Indeed, the novel systems described herein may be embodied in a variety of other forms; furthermore, various omissions, substitutions and changes in the form of the methods and systems described herein may be made without departing from the sprit of the inventions. The accompanying claims and their equivalents are intended to cover such forms or modifications as would fall within the scope and spirit of the inventions.

What is claimed is:

1. A nonvolatile semiconductor memory system, comprising:
   a semiconductor memory to store a data frame encoded with LDPC codes and soft-decision values, each corresponding to each of bits included in the data frame;
   at least one first error correction unit configured to perform a first error correction for the data frame according to a first iterative decoding algorithm;
   at least one second error correction unit configured to perform a second error correction for the data frame which is failed to correct error by the at least one first error correction unit, the second error correction being performed according to a second iterative decoding algorithm which uses a message having a larger number of quantization bits than that of the first iterative decoding algorithm, wherein the number of the at least one second error correction units is equal to or smaller than that of the at least one first error correction units;
   at least one third error correction unit configured to perform a third error correction for the data frame which is failed to correct error by the at least one second error correction unit, the third error correction being performed using the soft-decision value according to a third iterative decoding algorithm, the third iterative decoding algorithm using a message having a larger number of quantization bits than that of the second iterative decoding algorithm; and a memory interface configured to read the data frame and the soft-decision values of the data frame failed to correct error by the at least one second error correction unit from the semiconductor memory.

2. The system of claim 1, wherein the at least one first error correction unit calculates a syndrome weight representing number of "1" included in a data bit sequence obtained by a parity check, and the data frame is inputted into the at least one first error correction unit if the syndrome weight is smaller than a first threshold, the data frame is inputted into the at least one second error correction unit if the syndrome weight is larger than the first threshold and smaller than a second threshold, the data frame is inputted into the at least one third error correction unit if the syndrome weight is larger than the second threshold.

3. A nonvolatile semiconductor memory system, comprising:

a semiconductor memory to store a data frame encoded with LDPC codes and soft-decision values, each corresponding to each of bits included in the data frame;

at least one first error correction unit configured to perform an first error correction for the data frame according to a first iterative decoding algorithm;

at least one second error correction unit configured to perform a second error correction for the data frame which is failed to correct error by the at least one first error correction unit, the second error correction being performed using the soft-decision values according to a second iterative decoding algorithm, the second iterative decoding algorithm using a message having a larger number of quantization bits than that of the first iterative decoding algorithm, and the number of the at least one second error correction units is equal to or smaller than that of the at least one first error correction units;

at least one third error correction unit configured to perform a third error correction for the data frame which is failed to correct error by the at least one second error correction unit, the third error correction being performed using the soft-decision value according to a third iterative decoding algorithm, the third iterative decoding algorithm using a message having a larger number of quantization bits than that of the second iterative decoding algorithm; and a memory interface configured to read the data frame and the soft-decision values of the data frame failed to correct error by the at least one second error correction unit from the semiconductor memory.

4. A nonvolatile semiconductor memory system comprising:

a semiconductor memory to store a data frame encoded with LDPC codes;

at least one first error correction unit configured to perform a first error correction for the data frame according to a first iterative decoding algorithm; and at least one second error correction unit configured to perform a second error correction for the data frame which is failed to correct error by the at least one first error correction unit, the second error correction being performed according to a second iterative decoding algorithm which uses a message having a larger number of quantization bits than that of the first iterative decoding algorithm, wherein the at least one second error correction unit consumes more power than the at least one first error correction unit.

5. The nonvolatile semiconductor memory system according to claim 4, wherein the at least one second error correction unit has a larger circuit size than the at least one first error correction unit.

6. The nonvolatile semiconductor memory system according to claim 4, wherein the data frame is an ECC frame, the ECC frame being generated such that a parity data, corresponding to each of an information data based on a generator matrix G, is generated and the parity data is added to the information data.

7. The nonvolatile semiconductor memory system according to claim 4, wherein the second interactive decoding algorithm is a min-sum decoding algorithm.

8. The nonvolatile semiconductor memory system according to claim 7, wherein the message is a log likelihood ratio.

9. The nonvolatile semiconductor memory system according to claim 8, wherein the data frame is a ECC frame, and the log likelihood ratio is a logarithmic value of ratio between a probability $PR(bn=0)$ and a probability $Pr(bn=1)$, the probability $Pr(bn=0)$ is a probability that n-th bit of the ECC frame is "0" and the probability $Pr(bn=1)$ is a probability that n-th bit of the ECC frame is "1".

10. The nonvolatile semiconductor memory system according to claim 4, wherein a plurality of the at least one first error correction unit are arranged in parallel.

11. The nonvolatile semiconductor memory system according to claim 4, wherein the second error correction is performed independently from first error correction.

12. A nonvolatile semiconductor memory system comprising:

a semiconductor memory to store a data frame encoded with LDPC codes;

at least one first error correction unit configured to perform a first error correction for the data frame according to a first iterative decoding algorithm; and at least one second error correction unit configured to perform a second error correction for the data frame which is failed to correct error by the at least one first error correction unit, the second error correction being performed according to a second iterative decoding algorithm which uses a message having a larger number of quantization bits than that of the first iterative decoding algorithm, wherein the nonvolatile semiconductor memory system includes less second error correction units than first error correction units.

13. The nonvolatile semiconductor memory system according to claim 12, wherein the at least one second error correction unit has a larger circuit size than the at least one first error correction unit.

14. The nonvolatile semiconductor memory system according to claim 12, wherein a plurality of the at least one first error correction unit are arranged in parallel.

15. The nonvolatile semiconductor memory system according to claim 12, wherein the second error correction is performed independently from first error correction.

16. A nonvolatile semiconductor memory system comprising:

a semiconductor memory to store a data frame encoded with LDPC codes;

at least one first error correction unit configured to perform a first error correction for the data frame according to a first iterative decoding algorithm;

at least one second error correction unit configured to perform a second error correction for the data frame which is failed to correct error by the at least one first error correction unit, the second error correction being performed according to a second iterative decoding algorithm which uses a message having a larger number of quantization bits than that of the first iterative decoding algorithm; and a read buffer which stores the data frame, wherein if the first error correction unit fails the error correction for the data frame, the first error correction unit discards the data frame and the read buffer outputs the failed data frame to the second error correction unit.

17. The nonvolatile semiconductor memory system according to claim 16, wherein the at least one second error correction unit has a larger circuit size than the at least one first error correction unit.

18. The nonvolatile semiconductor memory system according to claim 16, wherein a plurality of the at least one first error correction unit are arranged in parallel.

19. The nonvolatile semiconductor memory system according to claim 16, wherein the second error correction is performed independently from first error correction.

* * * * *